(12) United States Patent  
Mori

(10) Patent No.: US 6,703,564 B2  
(45) Date of Patent: Mar. 9, 2004

(54) PRINTING WIRING BOARD

(75) Inventor: Shigeru Mori, Tokyo (JP)

(73) Assignee: NEC Corporation, Tokyo (JP)

( * ) Notice: Subject to any disclaimer, the term of this patent is extended or adjusted under 35 U.S.C. 154(b) by 272 days.

(21) Appl. No.: 09/812,817

(22) Filed: Mar. 21, 2001

(65) Prior Publication Data

US 2001/0023780 A1 Sep. 27, 2001

(30) Foreign Application Priority Data

Mar. 23, 2000 (JP) .......................................... 2000-83006

(51) Int. Cl.$^7$ ................................................. H05K 1/03
(52) U.S. Cl. ....................... 174/255; 174/256; 174/260; 174/261; 174/262; 361/760; 361/792
(58) Field of Search ................................ 174/255, 256, 174/258, 260, 261, 262; 361/760, 746, 792, 795; 257/778, 737; 428/209

(56) References Cited

U.S. PATENT DOCUMENTS 4,783,368 A  11/1988  Yamamoto et al.

FOREIGN PATENT DOCUMENTS

| EP | 0 139 205 | 5/1985 |
|---|---|---|
| EP | 0 221 531 | 5/1987 |
| JP | 7-81002 | 3/1995 |
| JP | 2551249 | 8/1996 |
| JP | 9-321430 | 12/1997 |
| JP | 2956370 | 7/1999 |
| JP | 11-330649 | 11/1999 |
| WO | 89/09534 | 10/1989 |
| WO | 00/11716 | 3/2000 |
| WO | 00/11919 | 3/2000 |

*Primary Examiner*—Kamand Cuneo  
*Assistant Examiner*—I. B. Patel  
(74) *Attorney, Agent, or Firm*—Foley & Lardner

(57) ABSTRACT

A printed wiring board is formed by a printed wiring substrate having a plurality of a wiring layer, and a thermal expansion buffering sheet having lower coefficient of thermal expansion than that of said printed wiring substrate, which is integrally laminated on a surface of the printed wiring substrate.

7 Claims, 2 Drawing Sheets

PRINTING WIRING BOARD

BACKGROUND OF THE INVENTION

1. Field of the Invention

The present invention relates to a printed wiring board, and more particularly to a printed wiring board excellent in reliability for surface mounting.

2. Description of the Related Art

Recently, as electronic appliances are becoming smaller in size and higher in density, the mounting method on the printed wiring board is mainly dominated by the so-called chip-on-board (COB) mounting system for mounting semiconductor parts directly on the printed wiring board.

In such surface mounting method, generally, the printing wiring board is manufactured by using a copper lined laminate (FR-4) for printed wiring board made of a glass cloth base material impregnated with an epoxy resin, and surface mount devices (SMDs) are mounted on the surface.

However, surface mount devices differ in size, shape and connection method, and also vary in the behavior (thermal expansion) due to temperature (heat). In particular, ceramic parts and bare chip parts are about 3 to 7 ppm in the coefficient of thermal expansion, and the parts which generate heat repeatedly by themselves are very large in difference in the coefficient of thermal expansion from the FR-4 printed wiring board of which coefficient of thermal expansion is about 13 to 20 ppm.

Accordingly, due to thermal stress after mounting parts, repeated stresses by expansion and contraction are concentrate on the electrodes for electrically connecting the substrate and the parts by soldering, and fatigue fracture may occur in the junction to cause breakage of wires.

The invention is devised in the light of such problems, and it is hence an object thereof to present a printed wiring board for surface mounting excellent in the connection reliability with the parts to be mounted on the surface.

SUMMARY OF THE INVENTION

To achieve the above-noted objects, the present invention adopts the following base technical constitution.

The first aspect of the present invention is a printed wiring board comprising: a printed wiring substrate having a plurality of a wiring layer, and a thermal expansion buffering sheet having a lower coefficient of thermal expansion than that of the printed wiring substrate, which is integrally laminated on a surface of the printed wiring substrate.

According to the first aspect of the present invention, since the printed wiring substrate is laminated with a thermal expansion buffering sheet of lower coefficient of thermal expansion than that of the printed wiring board, miss-matching of coefficient of thermal expansion between the surface mount parts and the printed wiring substrate is canceled by the thermal expansion buffering sheet, so that the reliability of mechanical and electrical connection of mounted parts is enhanced.

The second aspect of the present invention is characterized in that the coefficient of thermal expansion of the printed wiring substrate is 13 to 20 ppm, and the coefficient of thermal expansion of the thermal expansion buffering sheet is 6 to 12 ppm.

According to the second aspect of the present invention, miss-matching of coefficient of thermal expansion between the surface mount parts and the printed wiring substrate is canceled by the thermal expansion buffering sheet having lower coefficient of thermal expansion than that of the printed wiring substrate, so that the reliability of mechanical and electrical connection of mounted parts is enhanced.

The third aspect of the present invention is characterized in that the printed wiring substrate is a multi-layer wiring board which laminates wiring layers and insulation layers which are made of a glass cloth impregnated with an epoxy resin, alternately.

According to the third aspect of the present invention, it is possible to manufacture the printed wiring board at low cost by using the generally employed printed wiring substrate.

The fourth aspect of the present invention is characterized in that the thermal expansion buffering sheet is made of an aramid material.

According to the fourth aspect of the present invention, the aramid material has a coefficient of thermal expansion of about 9 ppm, being close to the coefficient of thermal expansion of the parts to be mounted, so that miss-matching of coefficient of thermal expansion between the surface mount parts and the printed wiring substrate is canceled, as the result, the reliability of mechanical and electrical connection of mounted parts is enhanced.

The fifth aspect of the present invention is characterized in that an electrode pattern so as to connect a part to be mounted on a surface of the printed wiring board is provided on a surface of the thermal expansion buffering sheet.

The sixth aspect of the present invention is characterized in that the part to be mounted on the surface of the printed wiring board is connected to the electrode pattern with a solder ball.

DESCRIPTION OF THE PREFERRED EMBODIMENTS

Figure 1:
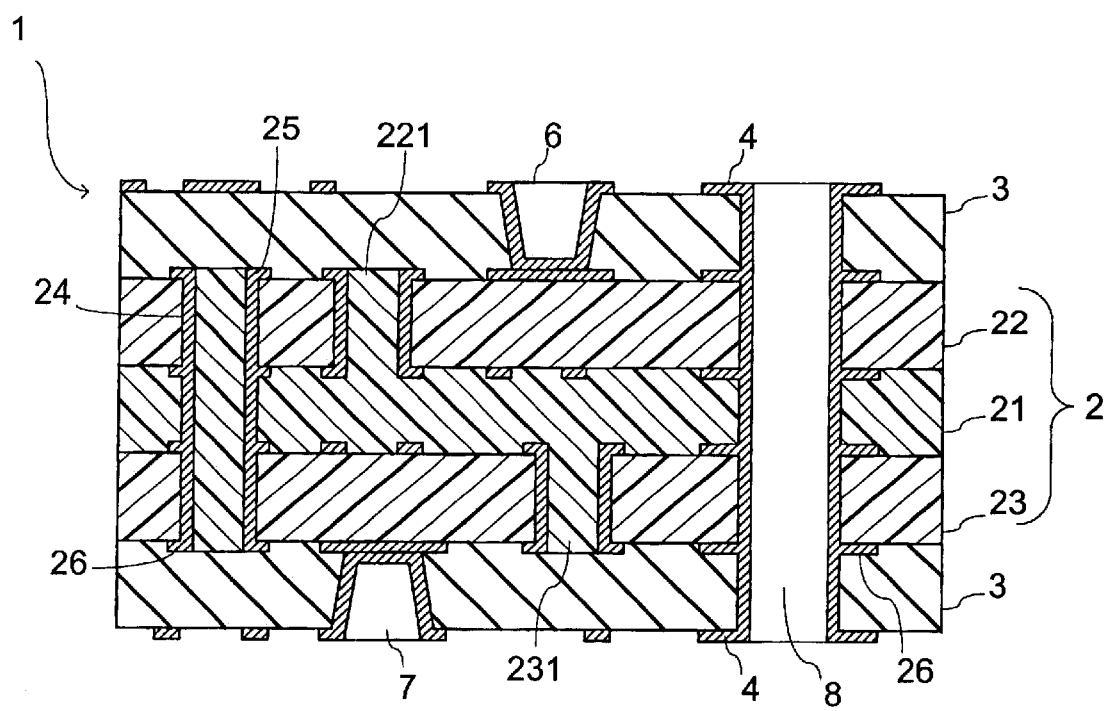
FIG. 1 is a sectional view showing a sectional structure of a printed wiring board of the invention.

An embodiment of a printed wiring board of the invention is described while referring to the drawings.

FIG. 1 shows a sectional structure of a printed wiring board of the invention.

This printed wiring board 1 has a laminated structure having thermal expansion buffering sheets 3, 3 integrally laminated on both sides of a printed wiring substrate (core material) 2. The printed wiring substrate 2 is, for example, a multi-layer wiring board (FR-4) which laminates wiring layers and insulation layers which are made of a glass cloth impregnated with an epoxy resin, alternately.

The printed wiring substrate 2 shown in FIG. 1 is composed of three layers of prepregs 21, 22, 23 of glass woven cloth impregnated with an epoxy resin. Copper foils are adhered to both sides of the prepregs 22, 23 by hot press, and the copper foils are formed into a circuit pattern by photolithography, and the prepreg 21 is held between them and laminated by hot press. Inner via holes 221, 231 are drilled in the prepregs 22, 23 forming the wiring pattern, and further a copper plating layer is formed inside of the inner via holes 221, 231 by plating method, so that the wiring patterns on both sides of the prepregs 22, 23 are mutually connected.

An inner via hole 24 penetrating through the entire printed wiring substrate 2 is formed, and further a copper plating layer is formed on the inner side of the inner via hole by plating method, and wiring patterns 25, 26 of the both sides of the printed wiring substrate 2 are mutually connected by the copper layer of this inner via hole. These inner via holes 221, 231, 24 are filled up with resin.

In the printed wiring board 1 of the invention, thermal expansion buffering sheets 3 having lower coefficient of thermal expansion than that of the printed wiring substrate 2 are laminated on both sides of the printed wiring substrate 2 integrally with the printed wiring substrate 2. The coefficient of thermal expansion of the thermal expansion buffering sheet 3 and the coefficient of thermal expansion of the members including the parts to be mounted are in the relation of "coefficient of thermal expansion of bare chip parts and ceramics of 3 to 7 ppm<coefficient of thermal expansion of thermal expansion buffering sheet of 6 to 12 ppm <coefficient of thermal expansion of printed wiring board of 13 to 20 ppm", and therefore it is preferred to define the coefficient of thermal expansion of thermal expansion buffering sheet in a range of 6 to 12 ppm because it is possible to lessen the impact by about ½ on the thermal impact width (expansion fluctuation) of both the coefficient of thermal expansion of bare chip parts and ceramics of 3 to 7 ppm, and the coefficient of thermal expansion of the printed wiring board of 13 to 20 ppm.

As the thermal expansion buffering sheet 3 having such coefficient of thermal expansion, for example, a resin of low thermal expansion such as aramid material, a glass cloth filled prepreg having low thermal expansion, or a resin material suppressed in thermal expansion by mixing ceramic powder, aluminum hydroxide powder or the like in a resin may be presented.

For bonding of the thermal expansion buffering sheet 3 to the laminated substrate 2, they can be integrated by a laminating press. On both side surfaces of the thermal expansion buffering sheet 3, wiring patterns 4 for mounting the surface mount parts are provided. In the wiring pattern 4, for example, via holes 6, 7 are formed on the thermal expansion buffering sheet 3 by laser, further a through-via hole 8 penetrating through the printed wiring board 1 is formed by drilling, and a copper plating layer is formed on the thermal expansion buffering sheet 3 by plating method. As a result, copper layers are formed on the inner side of the via holes 6, 7, 8, and on the surface of the thermal expansion buffering sheet 3.

Further, the copper layer is patterned by photolithography, and the wiring pattern 4 is formed. As a result, the printed wiring board 1 shown in FIG. 1 is composed.

Incidentally, the aramid material is not suited to forming of via holes by photolithography. By emitting laser to a specified position by laser method, via holes penetrating through the thermal expansion buffering sheet 3 can be formed.

Figure 2:
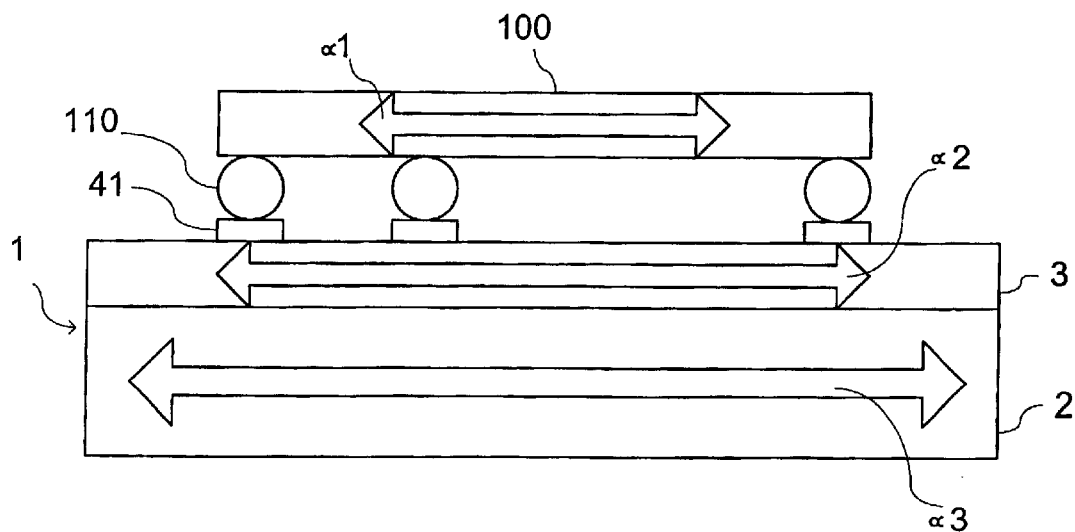
FIG. 2 is a magnified sectional view showing a mounted state of surface mount parts through solder balls for explaining the effects of the invention.

FIG. 2 shows a magnified view of the surface mount portion of a semiconductor device 100 having a ball grid array on the printed wiring board 1 according to the invention.

The semiconductor device 100 is electrically and mechanically bonded to a substrate electrode 41 of the wiring pattern 4 via micro solder balls 110. Accordingly, if the coefficient of thermal expansion $\alpha 3$ of the printed wiring board 2 and the coefficient of thermal expansion $\alpha 1$ of the semiconductor device 100 are different, a thermal stress due to temperature difference of the two occurs by miss-matching of coefficient of thermal expansion. This thermal stress acts on the junction of the solder balls 110, and the solder balls 110 are cracked or broken, and wire breakage may take place.

In the printing wiring board 1 of the invention, the thermal expansion buffering sheet 3 is interposed between the printed wiring substrate 2 and the mounted device 100. The coefficient of thermal expansion of FR-4 of the general printed wiring substrate made of glass cloth base material impregnated with an epoxy resin is about 13 to 20 ppm. On the other hand, the coefficient of thermal expansion of the surface mount parts such as semiconductor device is about 3 to 7 ppm.

The coefficient of thermal expansion $\alpha 2$ of the thermal expansion buffering sheet 3 is an intermediate coefficient of thermal expansion between the printed wiring board 2 and the surface mount parts 100, in particular, the semiconductor device directly mounted on the printed wiring board by ball grip array. Therefore, it is possible to lessen the repeated stresses due to expansion and contraction acting on the electrodes 41 for connecting electrically the printed wiring board 1 and the mounted part 100 by solder 110 caused by thermal stress, thereby preventing fatigue breakdown of the junction.

In particular, by using an aramid material as the thermal expansion buffering sheet 3, since the coefficient of thermal expansion of the aramid material is low, about 9 ppm, being closer to the coefficient of thermal expansion of the surface mount parts 100, thereby effectively lessening the miss-matching of coefficient of thermal expansion between the printed wiring board 2 and surface mount parts 100. Moreover, the aramid material also has a vibration absorbing action. Accordingly, when the aramid material is used as the thermal expansion buffering sheet 3, the reliability of electronic appliance against temperature changes can be enhanced, and the impact resistance of electronic appliance is also improved.

Parts to be mounted on the surface of the printed wiring board 1 of the present invention include WL-CSP mounted part, flip-chip (F/C) mounted part, ceramic part, and parts generating heat repeatedly. The printed wiring board of the present invention is excellent in reliability in junction with such surface mount parts.

Figure 3:
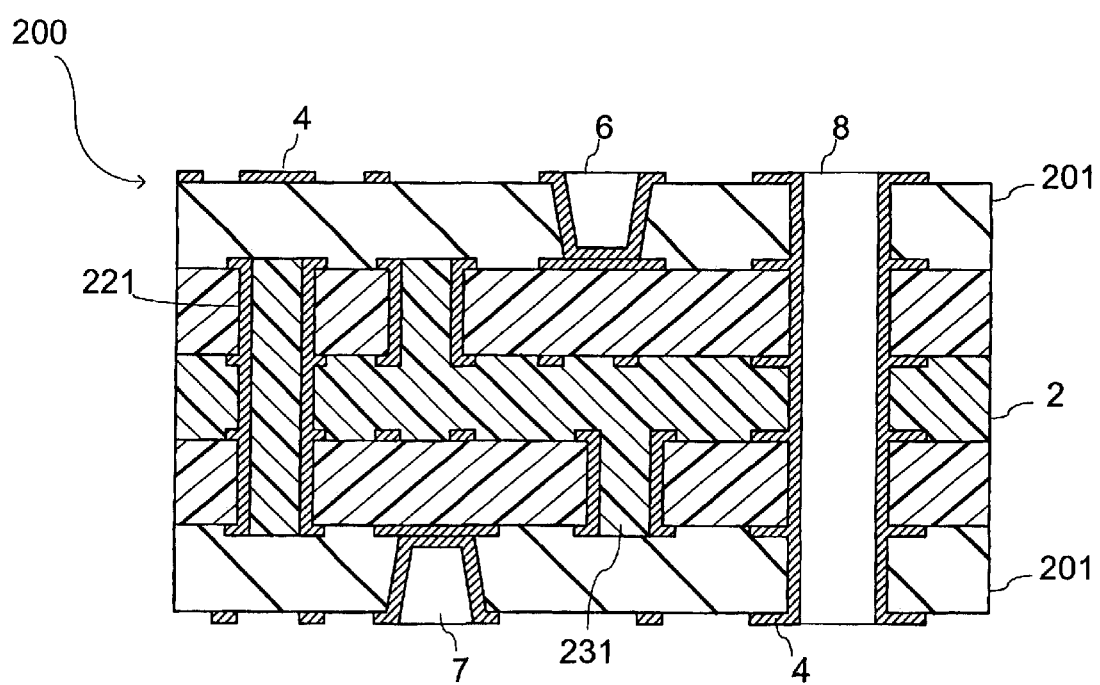
FIG. 3 is a sectional view showing a structure of a printed wiring substrate fabricated by a conventional build-up method.

The printed wiring board of the present invention may be manufactured in a same method as a printed wiring board 200 fabricated by a conventional build-up process as shown in FIG. 3. That is, the build-up process is a method of forming a multi-layer substrate by stacking up in an alternate laminating of conductor circuit layer 4 and organic insulating layer 201 on the printed wiring substrate 2.

In a specific process of build-up method, using, for example, FR-4 laminated substrate as the core material, through-holes are drilled in this laminated substrate, a copper layer is formed on the inner wall of the through-holes by plating method, and then the copper foil on the laminated substrate is formed into a wiring pattern. Consequently, the through-holes are filled up with epoxy resin or other resin, and the surface of the wiring pattern is coated with resin composition containing epoxy resin or the like by screen printing or other method, and an organic insulating layer 201 is formed.

Next, via holes 6, 7 communicating with the wiring pattern are formed by laser method. Then, as electroless plating pretreatment, a catalyst such as vanadium is adhered on the surface, and immersed in an electroless copper plating solution to precipitate copper, and a copper layer is formed on the surface including the inner surfaces of the via holes 6, 7 and through-via hole 8.

Consequently, the copper layer is patterned by photolithography, and the wiring pattern 4 and via wiring are formed.

In the manufacturing method of the printed wiring board 1 of the present invention, only the step of coating with resin composition containing epoxy resin by screen printing in the above process may be replaced by a step of hot pressing of thermal expansion buffering sheet of aramid material or the like.

Accordingly, the printed wiring board of the invention can be manufactured easily. Moreover, since the printed wiring substrates widely used at the present such as FR-4 can be used, it is possible to product at low manufacturing cost.

As described herein, the printed wiring substrate of the present invention can eliminate miss-matching of coefficient of thermal expansion between the surface mount parts and the printed wiring board, and enhance the reliability of mechanical and electrical connection of surface mount parts.

What is claimed is:

1. A printed wiring board comprising:
    a printed wiring substrate having a plurality of wiring layers;
    a thermal expansion buffering sheet integrally laminated on a surface of said printed wiring substrate and having a lower coefficient of thermal expansion than that of said printed wiring substrate;
    a semiconductor device provided on the thermal expansion buffering sheet; and
    an electrode pattern on a surface of said thermal expansion buffering sheet connecting the semiconductor device to a wiring section of said printed wiring board,
    wherein the thermal expansion buffering sheet has a higher coefficient of thermal expansion than the semiconductor device.

2. A printed wiring board according to claim 1, wherein a coefficient of thermal expansion of said printed wiring substrate is 13 to 20 ppm, and a coefficient of thermal expansion of said thermal expansion buffering sheet is 6 to 12 ppm.

3. A printed wiring board according to claim 1, wherein said printed wiring substrate is a multi-layer wiring board which laminates wiring layers and insulation layers which are made of a glass cloth impregnated with an epoxy resin, alternately.

4. A printed wiring board according to claim 1, wherein said thermal expansion buffering sheet is made of an aramid.

5. A printed wiring board according to claim 1, wherein the semiconductor device is connected to said electrode pattern via a solder ball.

6. A printed wiring board comprising:
    a multi-layer wiring section which laminates wiring layers and insulation layers alternately;
    a thermal expansion buffering sheet integrally laminated on a surface of said multi-layer wiring section and having a lower coefficient of thermal expansion than that of said multi-layer wiring section;
    a semiconductor device provided on the thermal expansion buffering sheet; and
    an electrode pattern provided on a surface of said thermal expansion buffering sheet connecting the semiconductor device to the multi-layer wiring section,
    wherein the thermal expansion buffering sheet has a higher coefficient of thermal expansion than the semiconductor device.

7. A printed wiring board comprising:
    a multi-layer wiring section which laminates wiring layers and insulation layers alternately;
    a thermal expansion buffering sheet, a material of which is aramid, integrally laminated on a surface of said multi-layer wiring section and having a lower coefficient of thermal expansion than that of said multi-layer wiring section;
    a semiconductor device provided on the thermal expansion buffering sheet; and
    an electrode pattern provided on a surface of said thermal expansion buffering sheet connecting the semiconductor device to the multi-layer wiring section,
    wherein the thermal expansion buffering sheet has a higher coefficient of thermal expansion than the semiconductor device.

* * * * *